US006977738B2

(12) United States Patent
Wood et al.

(10) Patent No.: US 6,977,738 B2
(45) Date of Patent: Dec. 20, 2005

(54) COMPOUND DOCUMENT PAGE DATA COMPRESSION

(75) Inventors: Elden Wood, Vancouver, WA (US); Steven O Miller, Vancouver, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 397 days.

(21) Appl. No.: 10/080,327

(22) Filed: Feb. 21, 2002

(65) Prior Publication Data
US 2002/0076101 A1 Jun. 20, 2002

Related U.S. Application Data

(63) Continuation of application No. 09/193,321, filed on Nov. 16, 1998, now Pat. No. 6,373,583.

(51) Int. Cl.[7] .............................................. H04N 1/40
(52) U.S. Cl. ..................................... 358/1.14; 382/232
(58) Field of Search ............................... 358/1.9, 1.14, 358/426, 261.1, 261.3, 426.01–426.16, 434; 382/166, 232, 244–247

(56) References Cited

U.S. PATENT DOCUMENTS

| 5,483,622 A | 1/1996 | Zimmerman et al. ....... 395/114 |
| 5,490,237 A | 2/1996 | Zimmerman et al. ....... 395/115 |
| 5,982,937 A * | 11/1999 | Accad ........................ 382/239 |

FOREIGN PATENT DOCUMENTS

| EP | 0149124 A | 7/1985 |
| EP | 0378762 A | 7/1990 |
| EP | 0703549 A | 3/1996 |
| EP | 0725485 A | 8/1996 |

OTHER PUBLICATIONS

The Hardcopy Observer, 1992 Guide to the Printer Industry, pp. 137-162, Technology Tutorial.
European Search Report, dated Feb. 7, 2000, for related European patent application 99117891.4-2202, filed Feb. 14, 2000.

* cited by examiner

Primary Examiner—Thomas D. Lee
Assistant Examiner—Stephen Brinich

(57) ABSTRACT

A fast, raster-based, enhanced, data compression technique for the printing of compound documents, including pre-processing images in an original page description form of the data before the page data is rasterized, greatly improving compressibility. Unscaled image data is filtered before it is rasterized to the final printing resolution. The filtering specifically enables a separate, near loss-less, compression algorithm to operate on a rasterized page description with high compression ratios. A data compression technique enables a system to compress compound document using a relatively fast and simple algorithm with near loss-less print quality.

8 Claims, 16 Drawing Sheets

COMPOUND DOCUMENT PAGE DATA COMPRESSION

RELATED APPLICATION

This application is a continuation of U.S. patent application Ser. No. 09/193,321 filed Nov. 16, 1998, now U.S. Pat. No. 6,373,583, by the same inventors herein named, for Compound Document Page Data Processing.

BACKGROUND OF THE INVENTION

1. Field of the Invention

The present invention relates generally to data processing and, more particularly, to data filtering and data compression for compound document pages including tristimulus spatial coordinate color image data.

2. Description of Related Art

Raster-based printers use a coding technique which codes each picture element, commonly called a "pixel," of alphanumeric character text or a computer graphic into a digital data format. A "compound document" includes both text and graphics, for example, an advertising page having both text and photographs. Data compression is used to reduce a data set for storage and transfer. Compressed raster data is output by a computer for decompression and printing by a hard copy apparatus such as a laser printer or ink-jet printer, facsimile machine, or the like. Reductions in the amount of total data needed to transfer a complete page data set compensates for limitations in input/output ("I/O") data rates and I/O buffer sizes, particularly in a limited memory, hard copy apparatus that receives such raster-based data. With raster data, the goal is to reduce the quantity of data transferred without affecting the visual quality characteristics of the document page. The following descriptions assume knowledge of an average person skilled in the art of both raster-based printing and data compression techniques. As used herein the term "image data" refers to photographs or other digitally scanned, or otherwise produced, sophisticated graphics.

Computerized systems that utilize loss-less compression techniques generally do not perform well on image data. While computationally achieving a 100:1 compression on text and business graphics (line art, bar charts, and the like) data, these complex algorithms usually achieve less than a 2:1 compression of image data. As a corollary, while image data can be compressed effectively with a "lossy" algorithm without significantly affecting perceptible image quality (e.g., the JPEG industry standard for photographs—having a disadvantage of being relatively slow in and of itself), data compression solutions that rely solely on lossy algorithms visibly degrade text data (such as by leaving visual artifacts), even at relatively low levels of compression. Moreover, lossy compression techniques do not achieve the desirable high compression ratios. Still further, the advantages of JPEG-like compression over other techniques are reduced when compressing image data that have been scaled using a pixel-replication scaling algorithm common to rasterized compound documents (e.g., 150 dot-per-inch ("dpi") image data scaled up to a resolution of 300-dpi or 600-dpi).

Solutions that use a mix of lossy and loss-less data compression are often slow and complex. For example, text and image data are sometimes separated to different channels, one containing the images using a lossy compression technique, like JPEG, and the other using a loss-less compression technique for text and simple business graphics. This separation of data into individual channels can be slow and the results are dependent on the architecture of the rasterization engine that initially rasterized the compound document. Moreover, the use of a lossy algorithm sometimes requires custom decompression hardware to achieve acceptable data processing speeds, which adds to the cost of a hard copy product. Again, the advantages of a JPEG-type algorithm are still reduced for images that have been scaled. Moreover, the relatively slow nature of JPEG is not improved even when compressing high resolution pixel replicated image data.

Thus, there is a need for a fast, raster-based, data compression technique for the transmission of compound documents, particulary useful for hard copy printing.

SUMMARY OF THE INVENTION

In its basic aspects, the present invention provides a data compression method for color image raster data, including the steps of: retaining individual pixel image data values for each recorded pixel color value of the color image raster data set that is different from both a preceding row, same column, pixel and a horizontally adjacent, same row, preceding pixel; and for each retained pixel image data value, encoding individual pixel image data values for pixels in a current pixel row with replacement data strings wherein the replacement data strings include a replacement positioning code and a replacement count code for replicating retained pixel image data values for subsequent raster data decompression as a group of substantially identical color value pixels.

In another basic aspect, the present invention provides a data compression method for compound document data, including the steps of: receiving a set of page description data representing a compound document page including at least one image data subset; extracting image data from the set of page description data; filtering the image data for enhancing subsequent data compression and outputting a filtered image data set; recombining the filtered image data set with the set of page description data from which the image data was extracted; rasterizing the set of page description data having the filtered image data set and outputting a set of rasterized page description data; and compressing the rasterized page description data and outputting a set of compressed rasterized page description data.

In yet another basic aspect, the present invention provides a computer memory having an image data compression program comprising: mechanisms for retaining individual pixel image data values for each recorded pixel color value of the color image raster data set that is different from both a preceding row, same column, pixel and a horizontally adjacent, same row, preceding pixel; and for each retained pixel image data value, mechanisms for encoding individual pixel image data values for pixels in a current pixel row with replacement data strings wherein the replacement data strings include a replacement positioning code and a replacement count code for replicating retained pixel image data values for subsequent raster data decompression as a group of substantially identical color value pixels.

In still another basic aspect, the present invention provides a data compression method for compound document data, including the steps of: receiving a set of page description data representing a compound document page; extracting image data from the set of page description data; filtering the image data and outputting a filtered image data set; restoring the filtered image data set to the set of page description data; rasterizing the set of page description data having the filtered image data set and outputting a set of rasterized page description data; and compressing the rasterized page description data and outputting a set of compressed rasterized page description. The image data is reduced from individual pixels to pixel blocks representing groups of adjacent pixels having substantially identical color values.

It is an advantage of the present invention that it provides data compression for documents with a mix of text, image data, and business graphics which can be compressed and decompressed quickly with high compression ratios.

It is an advantage of the present invention that it provides a near loss-less data compression and decompression.

It is an advantage of the present invention that it provides a data compression enhancement technique that can be tuned to trade image quality with compression ratio.

It is a further advantage of the present invention that it increases compression ratios for high resolution image data with substantially no perceptible image quality changes.

It is an advantage of the present invention that text and graphics portions of a compound document are compressed in a loss-less or near loss-less manner with high compression ratios.

It is a further advantage of the present invention that it is effective on images that have been scaled to a higher resolution through pixel replication.

It is another advantage of the present invention that no data separation between images and text or computer graphics is required during data compression and decompression.

It is another advantage of the present invention that it can be implemented in software.

It is yet another advantage of the present invention that software implementation enables faster implementation.

It is yet another advantage of the present invention that it has lower computational complexity which provides fast data compression and decompression.

It is another advantage of the present invention that it specifies an intermediate format which can convert from any host format to any format within a hard copy apparatus.

Other objects, features and advantages of the present invention will become apparent upon consideration of the following explanation and the accompanying drawings, in which like reference designations represent like features throughout the drawings.

BRIEF DESCRIPTION OF THE DRAWINGS

FIGS. 2A-1 to 2A-4 are a subroutine flowchart of the filtering branch of the system and methodology as shown in FIG. 2.

FIGS. 2B-1 to 2B-3 are a subroutine flowchart of the filtering branch of the system and methodology as shown in FIG. 2.

FIG. 4 is a top level flowchart of a data compression branch of the system and methodology as shown in FIG. 1.

FIGS. 4A-1 to 4A-2 are a subroutine flowchart of the data compression branch of the system and methodology as shown in FIG. 4.

FIGS. 4B-1 to 4B-2 are a subroutine flowchart of the data compression branch of the system and methodology as shown in FIG. 4.

The drawings referred to in this specification should be understood as not being drawn to scale except if specifically noted.

DESCRIPTION OF THE PREFERRED EMBODIMENT

Reference is made now in detail to a specific embodiment of the present invention, which illustrates the best mode presently contemplated by the inventors for practicing the invention. Alternative embodiments are also briefly described as applicable. Basic knowledge of a person skilled in the arts comprising computerized color imaging and digital data compression is assumed for the following description. Subtitles used herein are for the convenience of the reader; no limitation on the scope of the invention is intended nor should any be implied therefrom.

General

Figure 1:
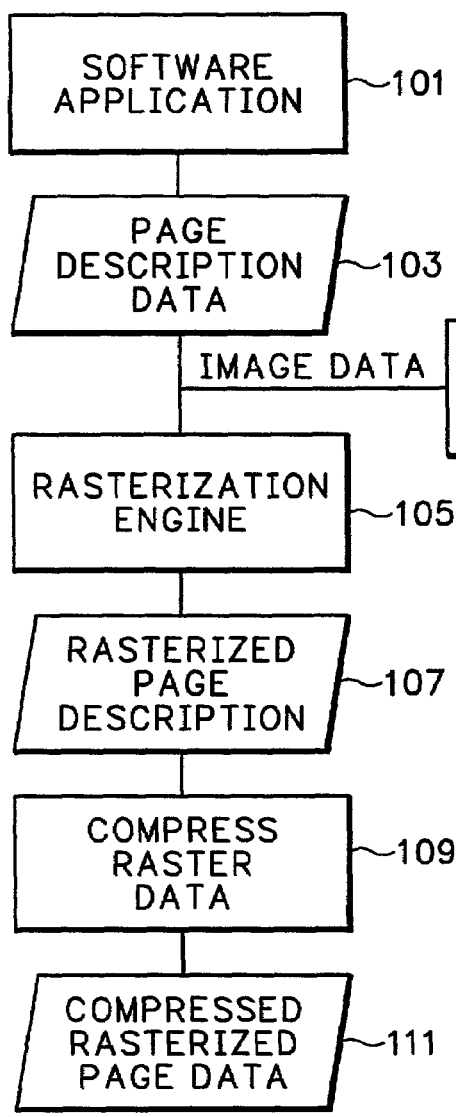
FIG. 1 is an overall system block diagram and methodology flowchart in accordance with the present invention.

Turning to FIG. 1, the present invention provides a method for fast, raster-based, enhanced, data compression technique for the printing of compound documents, including pre-processing images in an original page description form of the data before the page data is rasterized and compressed. Computer programs generate page description data, "PDD," 103 in proprietary and industry standardized data formats. Examples of pre-rasterized PDD well known in the art are PostScript™, Windows™ enhanced metafiles, PCL™-5 (a "printer control language" developed and promulgated by Hewlett-Packard Company, the assignee of the present invention, as a widely-used, standard, driver software for laser page printers), QuickDraw™ Pict™, and the like software applications 101. U.S. Pat. Nos. 5,483,622 and 5,490,237 (Zimmerman et al., assigned to the common assignee of the present invention) are illustrative of PCL techniques and are incorporated herein by reference in their entireties; see also, *The Hardcopy Observer* 1992 *Guide to the Printer Industry*, pages 151–158, incorporated herein by reference in its entirety.

Figure 2:
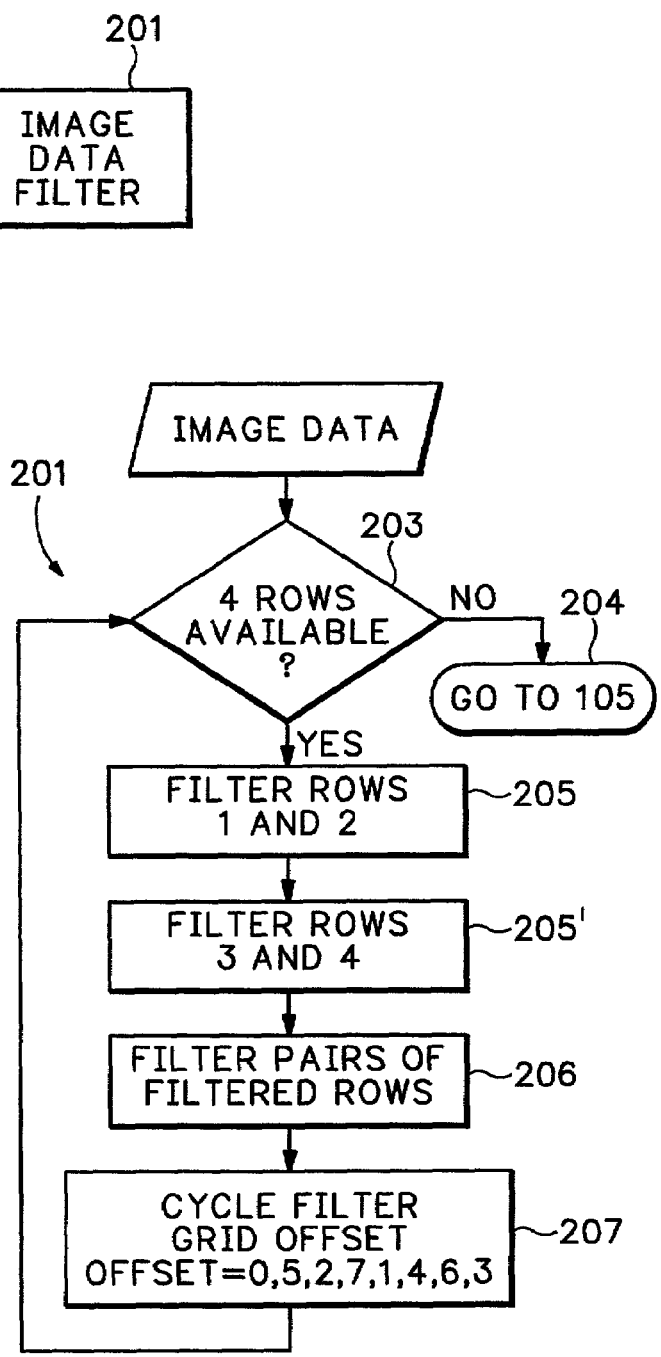
FIG. 2 is a top level flowchart of image data filtering branch of the system and methodology as shown in FIG. 1.

In any known manner, image data is extracted from the PDD 103 and sent to an image filter 201, FIG. 2, before being sent back to a known manner rasterization engine 105, FIG. 1. The image data extracted from the PDD 103 is in the form of pixel-by-pixel spatial coordinates [e.g, for red/green/blue, color space coordinate digital data triplets "$R_{7\text{-}0}$ $G_{7\text{-}0}$ $B_{7\text{-}0}$"; for cyan/magenta/yellow primary color data, digitized data triplets "$C_{7\text{-}0}$ $M_{7\text{-}0}$ $Y_{7\text{-}0}$" (see e.g., *Color Science: Concepts and Methods, Quantitative Data and Formulae*, Wyszecki & Stiles, second ed., copr. 1982 John Wiley & Sons)]. The image filtering algorithm 201 operates on the original, unscaled image data, making it more compressible for a loss-less compression algorithm.

Image Data Filter

The image filter 201 first looks at pairs of pixels and averages the data if the pixels are close enough in value so as to minimally affect print quality. In the preferred embodiment, compared pixels are considered to be substantially the "same" color value when their value is within a predetermined value, e.g., an initial difference color of:

$$\text{ERROR} = (3*\text{difference value Red} + 4*\text{difference value Green} + 2*\text{difference value Blue}) + 8 \quad \text{[Equation 1]},$$

where "difference value 'color'" means the spatial coordinate value difference [e.g., Red coordinate value$_{current\ pixel}$–Red coordinate value$_{comparison\ pixel}$]. The multipliers for each coordinate in Equation 1 were selected as roughly the equivalent to the human visual response to color components as produced in a color hard copy apparatus, such as an ink-jet printer. The filter then coalesces pixels to form "blocks." When a block is averaged [Red$_{final}$=(R$_{PIXEL0}$+R$_{PIXEL1}$)/2; Green$_{final}$=(G$_{PIXEL0}$+G$_{PIXEL1}$)/2; and Blue$_{final}$=(B$_{PIXEL0}$+B$_{PIXEL1}$)/2, where standard pixel$_0$ and pixel$_1$ color values are expressed in a selected one of the standard tristimulus color space coordinate systems], the two pixels within that block are effectively set to a single color value which greatly enhances compressibility. This forms pixel blocks that may again be averaged with neighboring blocks to create larger blocks, or "super-blocks," of pixels with same color values in them, e.g., a large photographic area of a clear blue sky. Similarly, pixel super-blocks can be iteratively averaged until a predetermined super-block size is reached. In other words, raw PDD pixels are "grown" to whatever size is practical for color error tolerance or to a predetermined size. As the area grows, the tolerance is reduced. Initial allowable error as set forth in Equation 1 is halved each time the size of a block of averaged pixels doubles in the x-axis (horizontally across the image) or the y-axis (vertically along the image). Block sizes stop growing when the error value would exceed the allowable threshold. In the preferred embodiment, block sizes up to 8-pixels by 4-pixels are created unless error tolerance is exceeded. The filter algorithm 201 operates on a predetermined number of rows of pixels, e.g. four rows, for comparing and coalescing pixels into rectangular blocks of pixels, or super-blocks, of a single color therefrom into the predetermined sized block. The first test 203 is whether a sufficient number of rows are remaining in the data stream for filtering.

Figures 1, 2A:
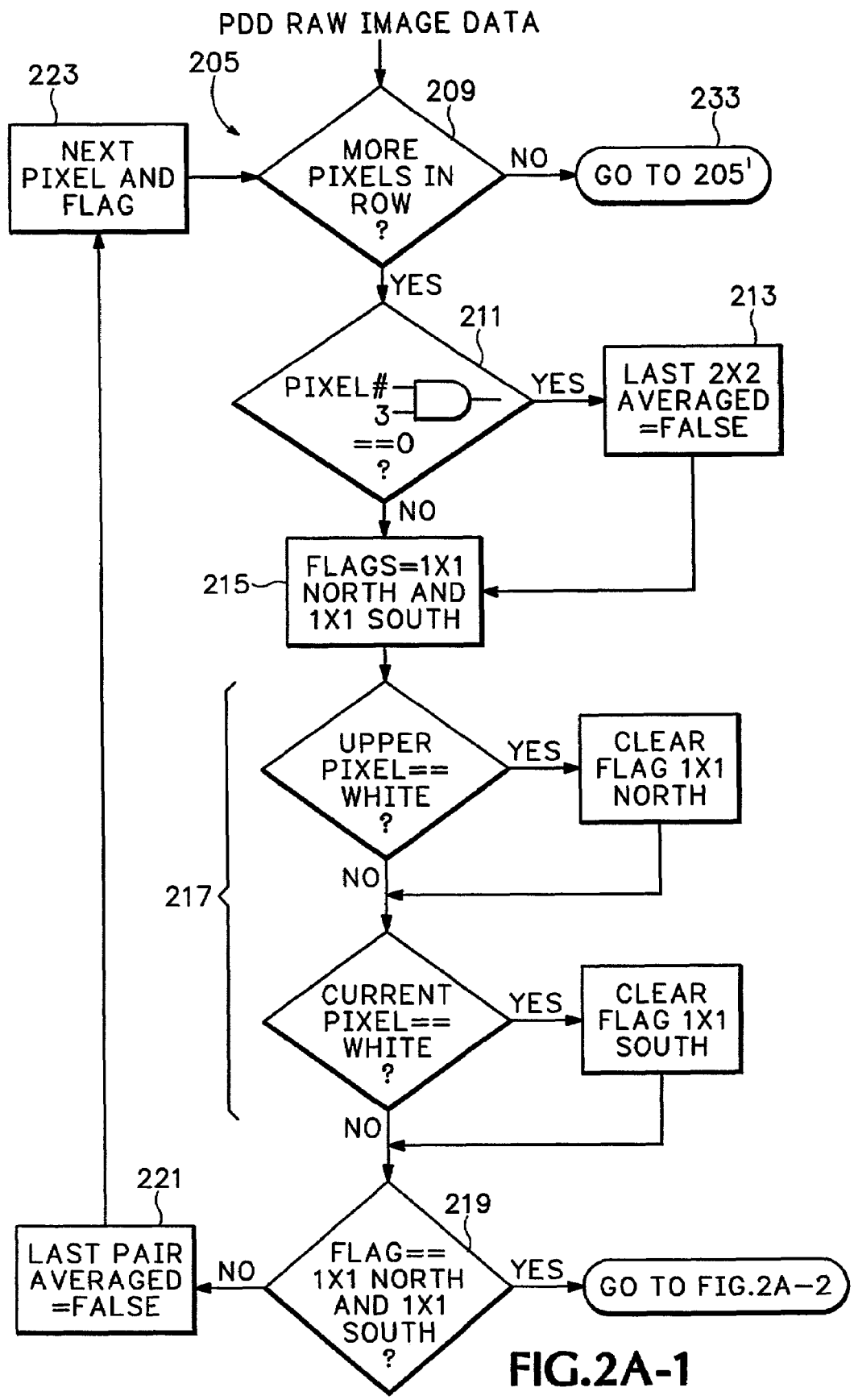
Figures 2, 2A:
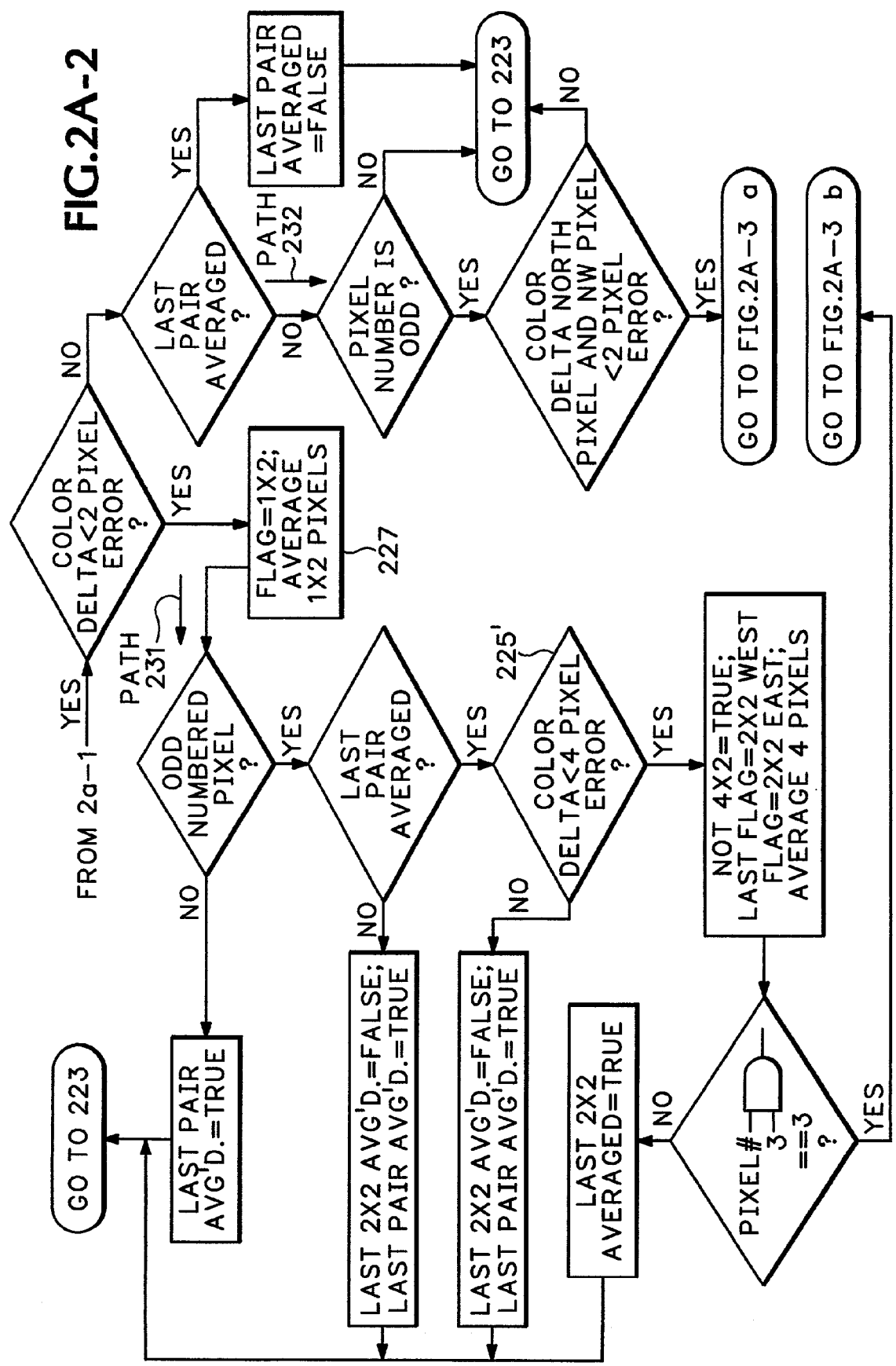
Figure 3A:
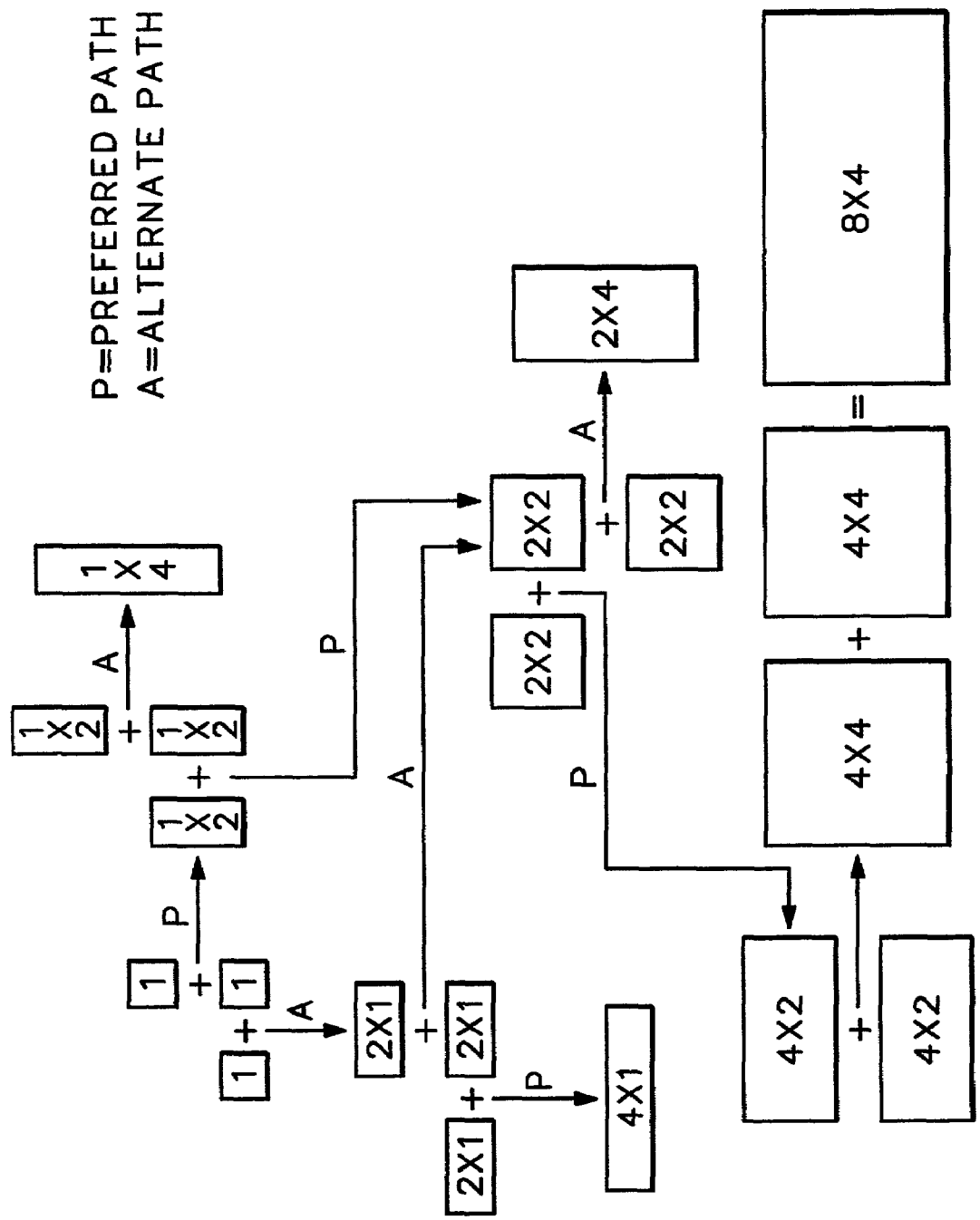
FIGS. 3A and 3B are pictorial representations of the pixel data processing subroutines as shown in FIGS. 2A and 2B and the pixel grid alignments used for creating coalesced blocks of pixels.
Figure 3B:
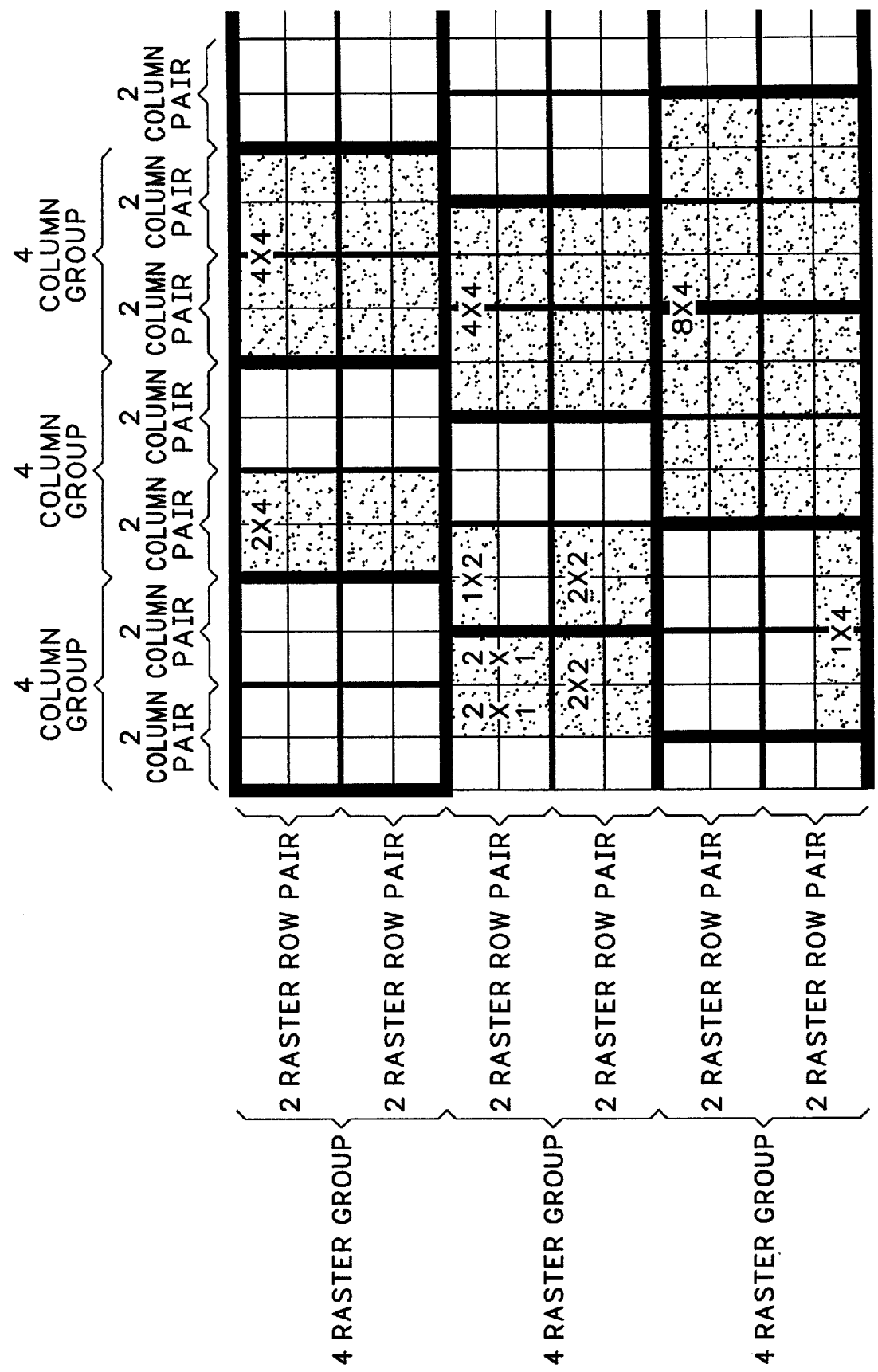

Assuming, for this example, there are at least four rows left in the image for filtering, the data of the first two rows of the four under consideration is processed 205 as shown in FIG. 2A. It will also be beneficial to refer simultaneously to FIGS. 3A and 3B which schematically depict pixel grid alignments used for creating coalesced blocks of pixels in accordance with the process of the present invention.

The PDD row data 208 for the two adjacent rows are compared pixel-by-pixel 209. For convenience of description, a previous or superjacent pixel row in the y-axis is designated "north"; adjacent column pixels in the x-axis are designated "east" and "west" of each other; thus, adjacent pixels of a 2×2 pixel set can then be described as north/south/east/west/northeast/et seq. [It should be recognized that directions are relative as PDD could be manipulated top-to-bottom, bottom-to-top, left-to-right, right-to-left; thus these designators are used for facilitating this description and are not intended as limitations on the scope of the invention nor should such intention be implied.] Referring to FIG. 3B, a grid is formed, where the dark vertical lines every four pixels indicates the placement of where blocks are coalesced. Two-by-two (2×2) pixel sets are processed. A logical AND, step 211, specifies when filtering on a multiple of four boundary.

When not a multiple of four boundary, the 2×2 pixel set is flagged 215 for filtering. When a multiple of four boundary, the last 2×2 pixel is flagged as not averaged and the 2×2 pixel set is flagged 215 for filtering. The remaining steps 217–233 of the subroutine of FIG. 2A shows a typical two row-pixel pair averaging process. It will be recognized by a person skilled in the art that a similar data reduction subroutine can be implemented for a filter sized other than in this particular exemplary embodiment.

Figures 2, 2A, 3:
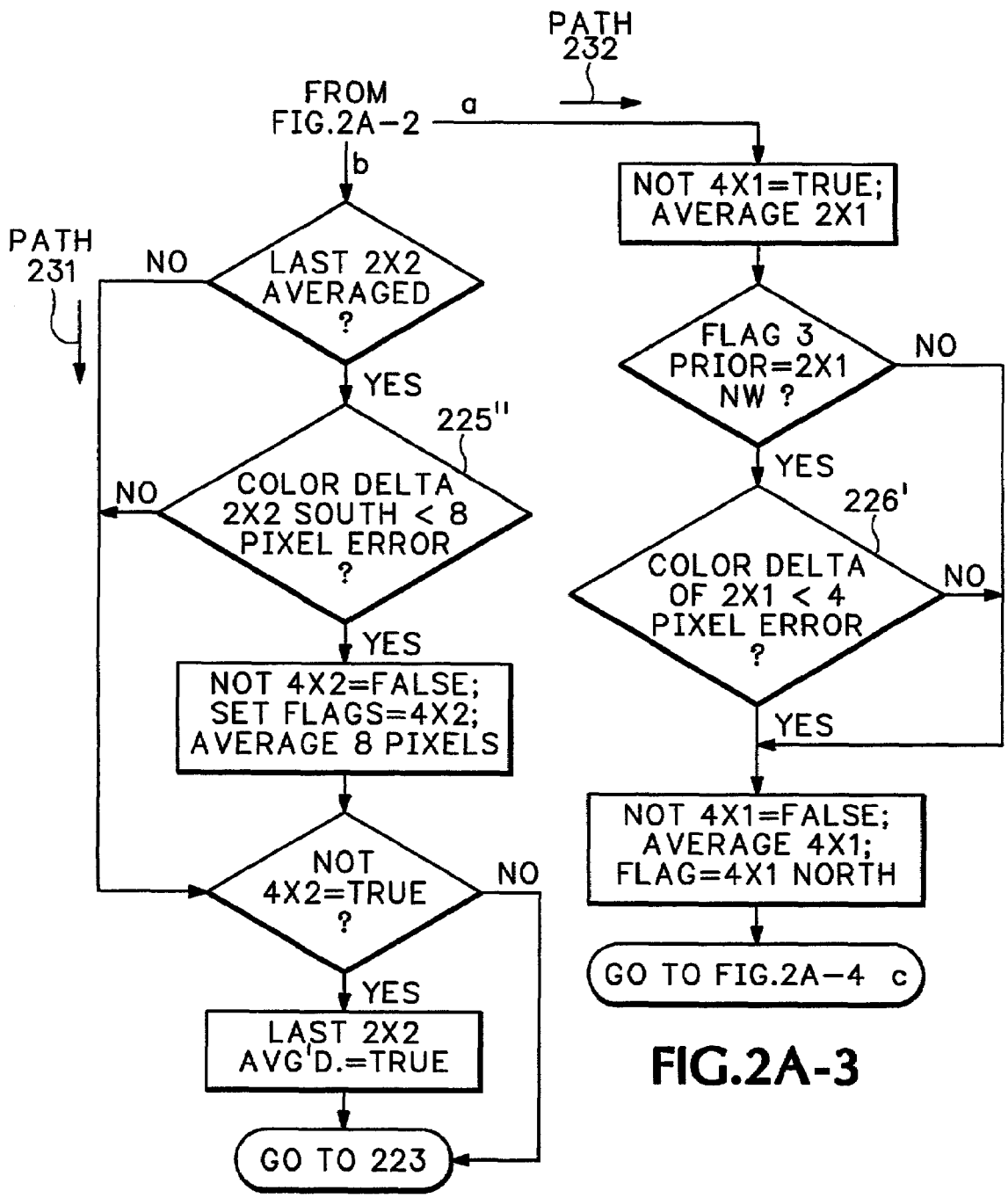

For pixels where no color data is resident, namely white regions of the image where the north pixel and south pixel are both white, the subroutine simply moves on 219, 221, 223 (return and shift point) to the next pixel available for comparison.

Where color data is resident (217, No-path), a first COLOR_RELATIVE_VALUE_ERROR (also referred to in the FIGURES as "color delta") threshold test 225 determines the filtering path. If the COLOR_RELATIVE_VALUE_ERROR is less than the predetermined threshold between the current pixel and the pixel north thereof 225, Yes-path, the current pixel and its vertically adjacent pixel, the north pixel, are averaged 227, as also shown in FIG. 3 by the first "P"-path, starting from the upper left corner of the drawing. In FIG. 3, note that the arrows designated "P" show the preferred super-block growth data processing path; alternate paths are designated "A." The target goal for a two-row raw PDD comparison is a 4×2 super-block.

If the difference between a current pixel and its north pixel is more than the initial COLOR_RELATIVE_VALUE_ERROR threshold 225, No-path, meaning that no data reduction can be implemented between the current pixel and the north pixel, then east/west comparison is implemented as also shown in FIG. 3 by the first A-path in the upper left-hand corner. A pixel averaging, which can rapidly determine whether there are remaining pixels still to be grouped until an iterative test fails, thereafter proceeds through either path, designated 231 and 232, for as long as an initial current pixel can be grown to a predetermined super-block construct. That is, in the present exemplary embodiment until the targeted 4×2 block from two rows of PDD is reached, or a dead end in FIG. 3 is reached, or until an ERROR value would exceed the allowable predetermined threshold, for block of area 2, wherein the initial predetermined threshold allowable 225, 226 is iteratively halved 225', 225", 226', 226" for each succeeding comparison.

This pixel coalescence process loops for the first two rows of pixels until finished 209 and returns to the top level process of FIG. 2. An identical subroutine 205 is run on the next two rows, designated subroutine 205' in FIG. 2. Once the second two rows are filtered, there is a pair of filtered rows data to be coalesced 206, containing coalesced blocks of up to 4×2 in size.

Figures 2, 2A, 3, 4:
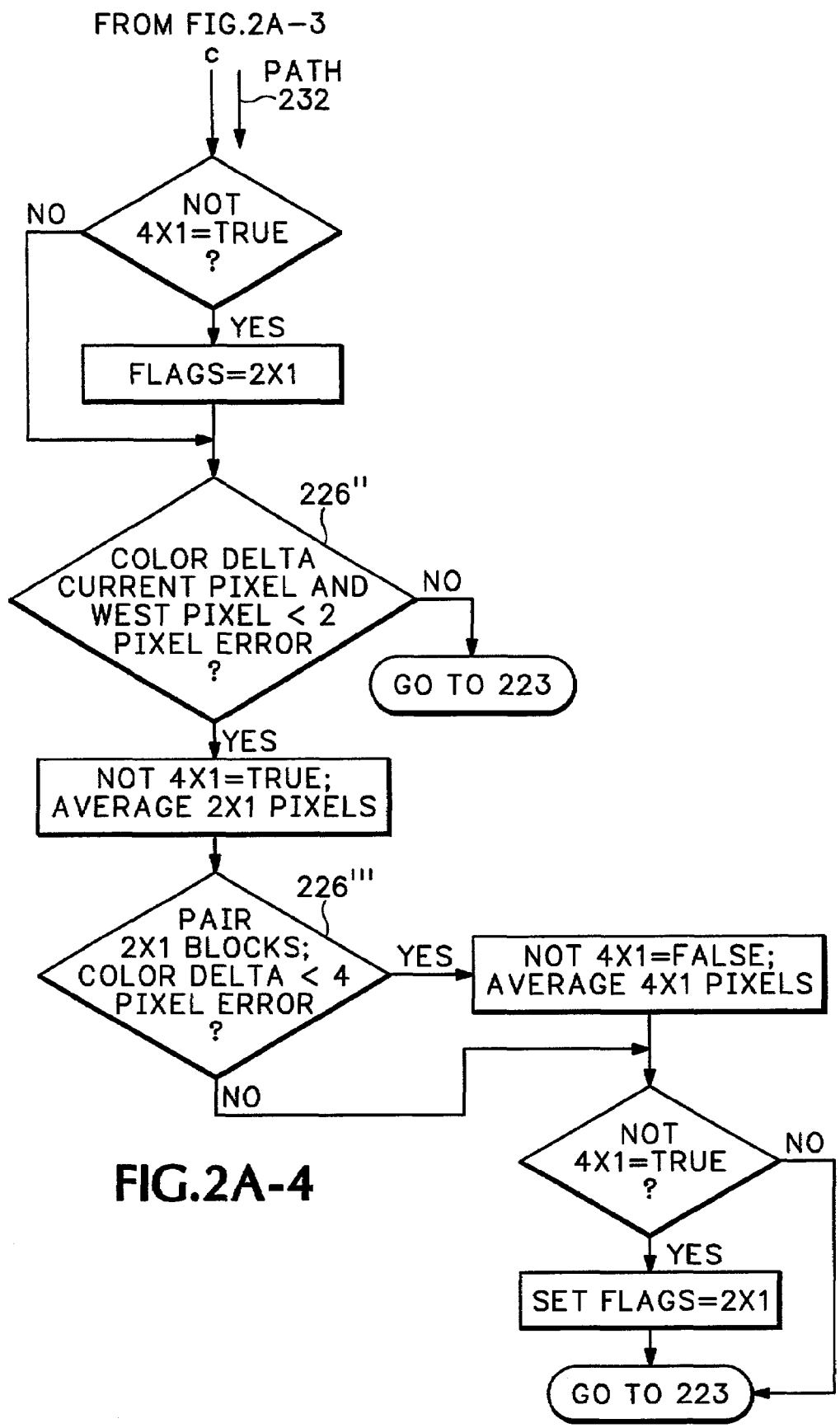
Figures 1, 2B:
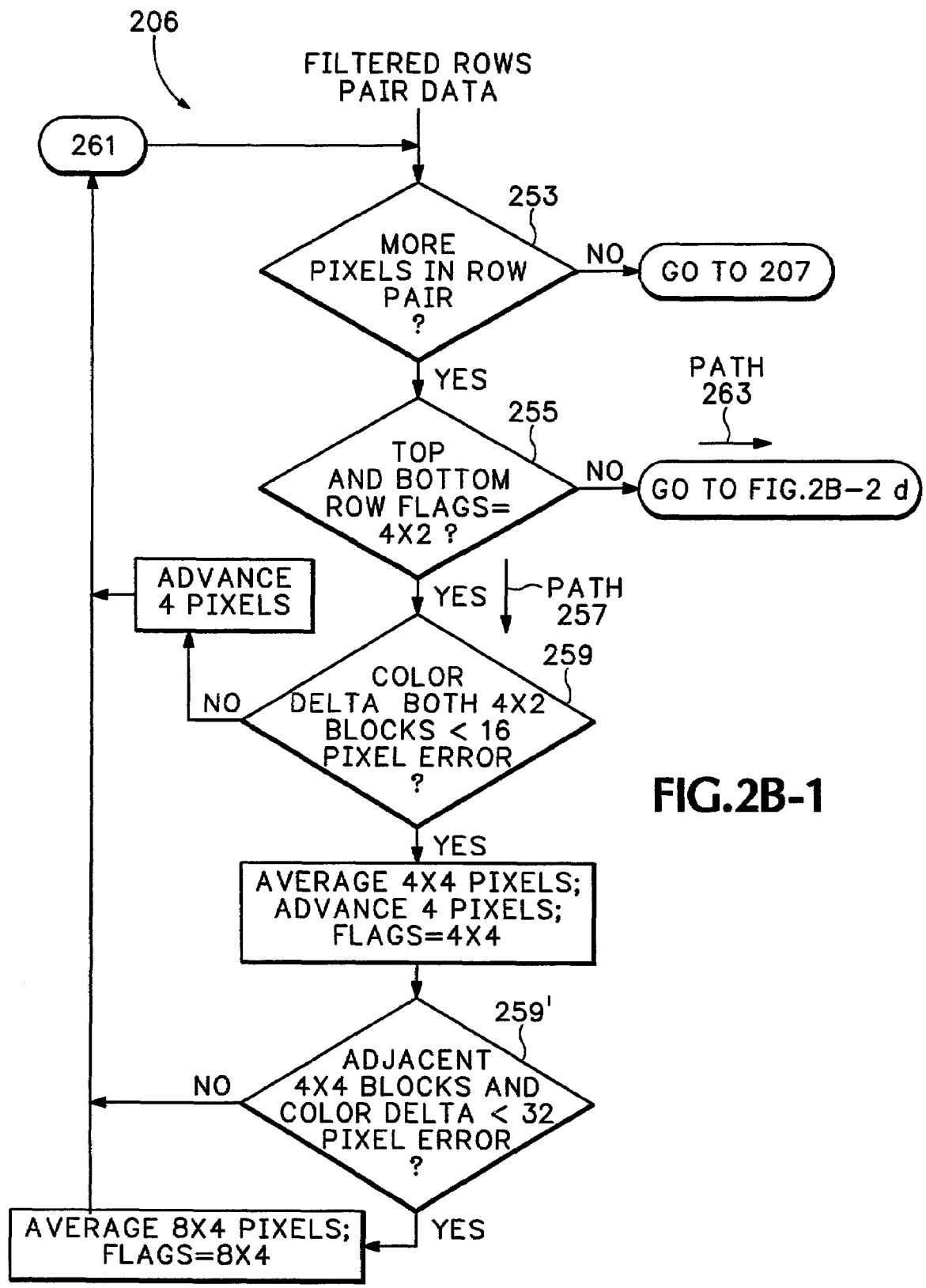
Figures 2, 2B:
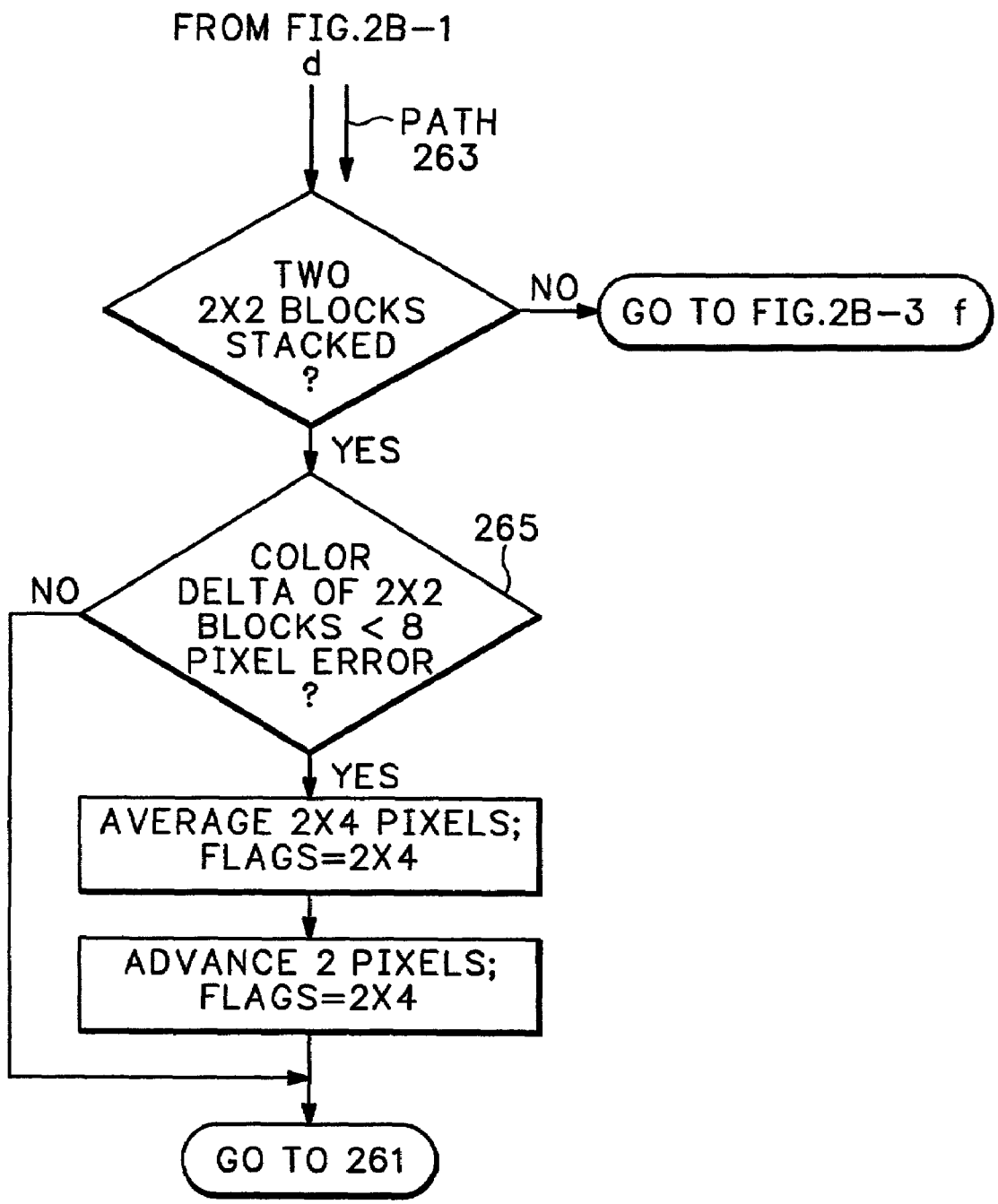
Figures 2, 2B, 3:
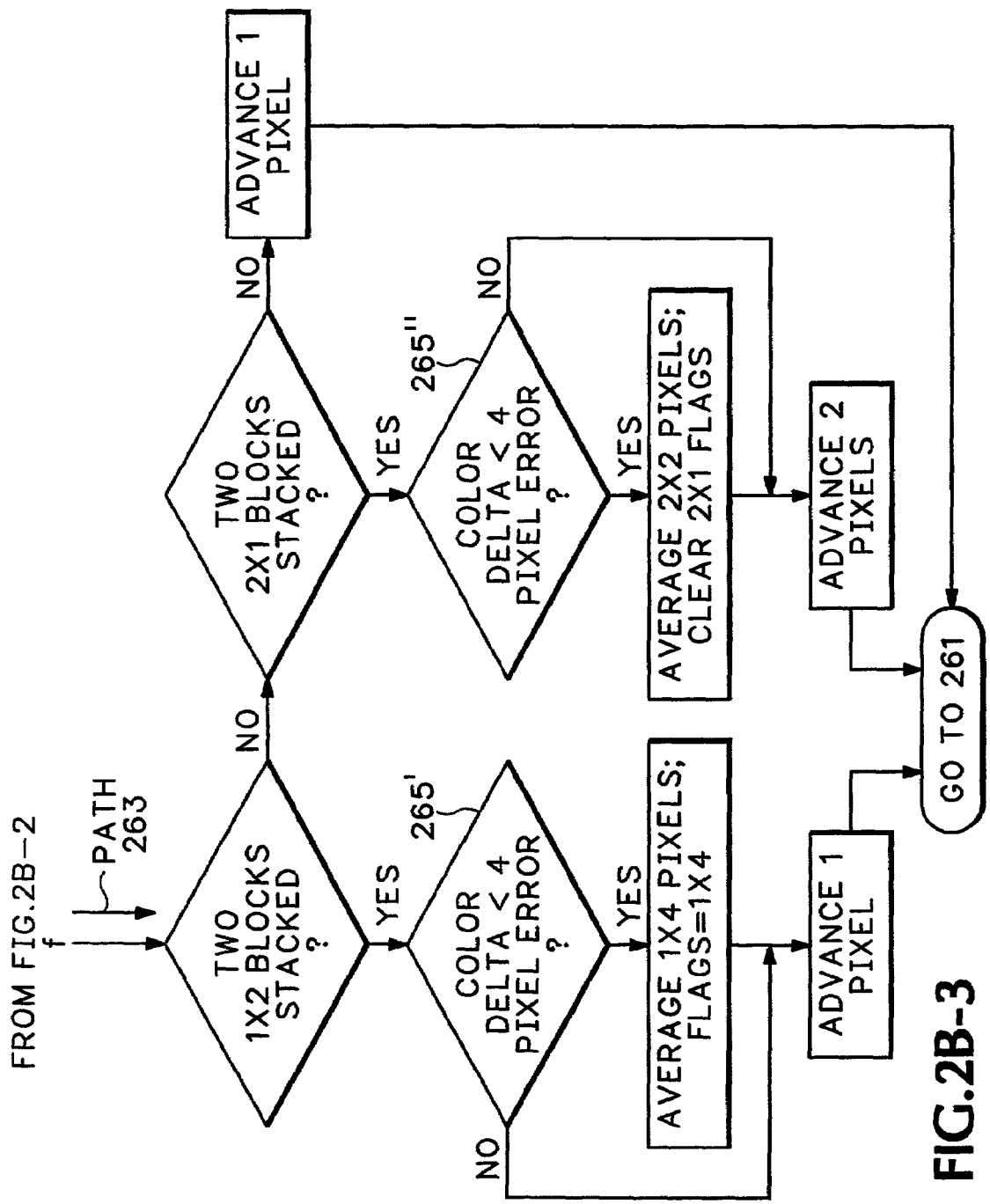

FIG. 2B is the subroutine 206 (see also FIG. 2) for coalescing the data of the pair of filtered rows to a final goal of an 8×4 block value that can be used for data compression. As long as there are pixel blocks available for comparison 253, further filtered rows pair coalescence can be performed. A test is implemented 255 to determine the results of the initial row pair filtering subroutines 205, 205'. When a preferred path "P" has been implemented throughout, two 4×2 blocks, vertically stacked will exist, 255, Yes-path. In the then following subroutine steps, generally designated path 257, as with the individual row pixel data, the filtered rows pair data is compared to the iteratively halved ERROR threshold 259, 259'. The process loops 261 back to the next block set of the filtered rows pair data.

When an alternate path has been required, 255, No-path, the initial row pair filtering subroutines 205, 205' will have achieved a less than 4×2 coalescence, e.g., 2×1, 1×2, 2×4, dependent upon the particular path followed in FIG. 3. Therefore, alternative filtering paths, generally designated path 263, to coalesce such lesser blocks is followed, similarly finding and averaging blocks when the iteratively halved ERROR threshold appropriately to the size blocks to be averaged 265, 265', 265". Once there are no more blocks to be considered 253, the process returns 265 to the top level image filter routine 201.

The top level filter 201 advances 207 to the next grid of four rows and repeats. The grid offset is cycled as demonstrated in FIG. 3B to minimize visual artifacts from the coalescing process.

Returning now to FIG. 1, the fully filtered PDD image data from the filter routine 201 is recombined with the rest of the data, e.g., text, bar charts, and the like, and rasterized 105 in a known manner convenient to the particular implementation. The rasterized page description, "RPD," 107 now constitutes a data set that is in a more compressible form than existed in the original PDD 103 with respect to the image data content. Note the advantage that only single page of data still exists and is rasterized 107 in accordance with known processes; that is, the data has not been separated into multiple channels. A compression algorithm engine 109 can thus be a loss-less compression technique normally reserved for text and business graphics type data only.

Compression

FIG. 4 details a preferred embodiment data compression algorithm 109. It will be recognized by a person skilled in the art that a different compression algorithm may be employed on RPD data 400. While the RPD data 400 in the preferred embodiment is the set 107, FIG. 1, that has been filtered for enhanced compressibility, note that the rasterized page description data can also be any other rasterized image data set ready for compression.

In the main, the near loss-less version of this algorithm 109 combines the elements of run-length encoding with a seed-row-relative value encoding, modified to handle a 24-bit RGB format, where the "seed row" is a vertically adjacent (i.e. superjacent or "north") pixel row to the row in which current pixel data is being considered for compression. In the preferred embodiment, this compression formatting records only pixels that are different from both a vertically adjacent pixel and a horizontally adjacent pixel, e.g., the pixel above, "north," and the pixel to the left, "west." These are the logical choices since the values therefor have been recorded; however, it should be recognized that other adjacent pixel data can similarly be used for color value comparison and that while the north and west pixels are the preferred embodiment choice, no limitation on the scope of the invention is intended thereby nor should any be inferred therefrom.

If a recorded pixel is of a value substantially similar in color value to the corresponding pixel in the seed row (see step 451, infra), namely the superjacent, or north, pixel to the current pixel, it is recorded as a 16-bit relative quantity that encodes the difference. This enables many pixels to be encoded in a 16-bit field as opposed to a 24-bit field.

More specifically, the RPD pixel data 400 is considered by the compression algorithm 109 as a pair of pixel rows: a "current row" and its preceding row, the "seed row," pixels again being considered as having a relative north/south vertical orientation and an east/west horizontal orientation. At the beginning of a row, the "current pixel" immediately follows the left raster margin. Thereafter, the "current pixel" refers to the pixel in the current row being processed.

The current pixel is compared 403, 405 to a vertically adjacent pixel, e.g., the north-located seed row pixel. If identical, an offset count is incremented 406. An offset of zero, "0", indicates the current pixel; an offset of one, "1," indicates the pixel following the current pixel. When not identical 405, the current pixel is compared to the following west-located pixel 401', 407. If identical, replacement pixel run, "RPR," compression is used 409, FIG. 4B. When not identical, replacement pixel relative value data is generated 411, FIG. 4A.

Figure 5:
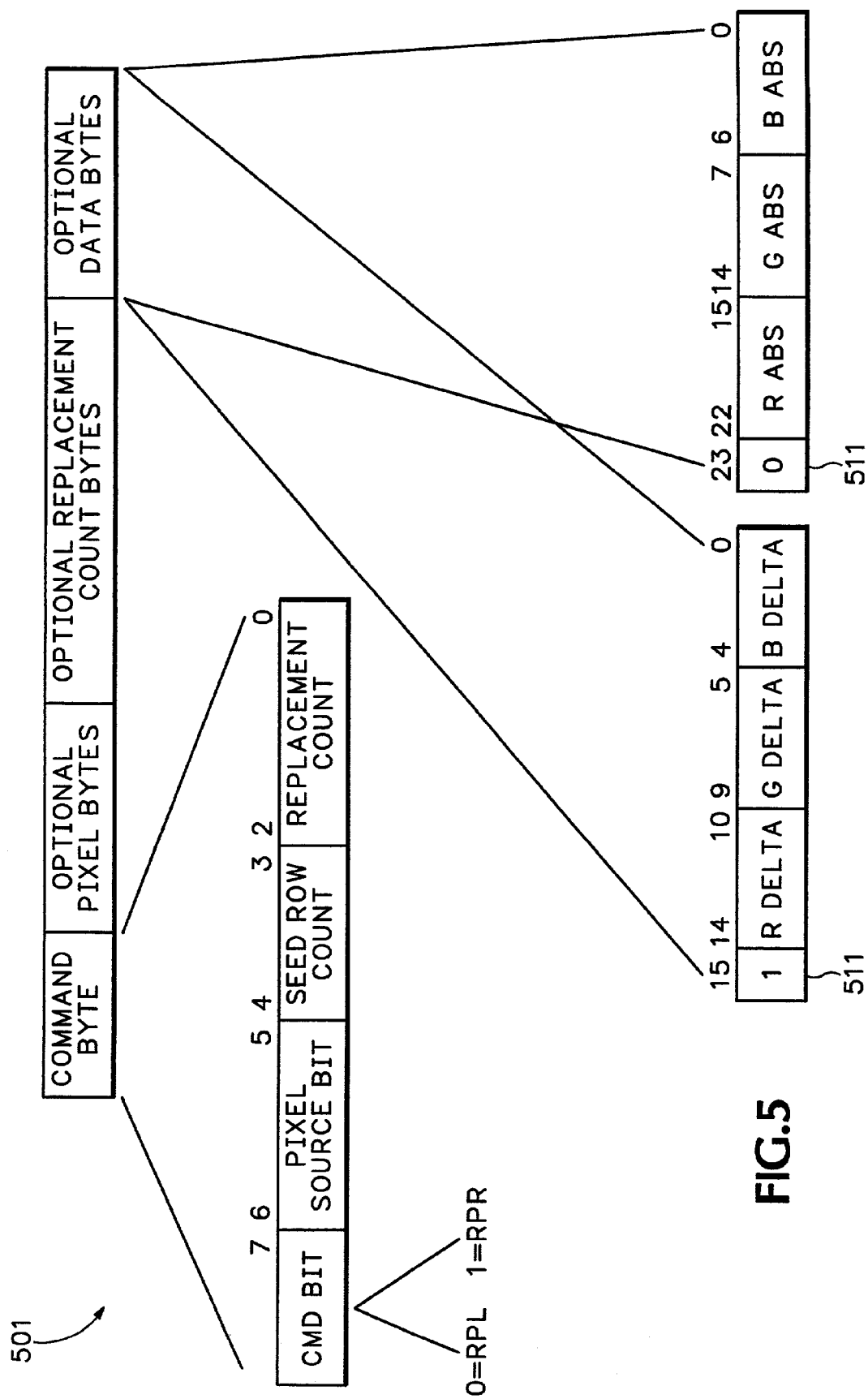
FIG. 5 is a schematic representation of the replacement data string for the data compression branch of the system and methodology as shown in FIGS. 4, 4A and 4B.

FIG. 5 depicts an encoding format for compressed raster pixel data, RPD. Data 501 consists of a command byte and optional seed row offset value fields, replacement count value fields, and color data. Replacement pixel data replaces the raw RPD with a replacement data string, also referred to herein as the "relative value string," which consists of a command, color data; optional seed row offset value and replacement count value fields are provided as needed. A series of replacement strings describe a raster.

Figure 4:
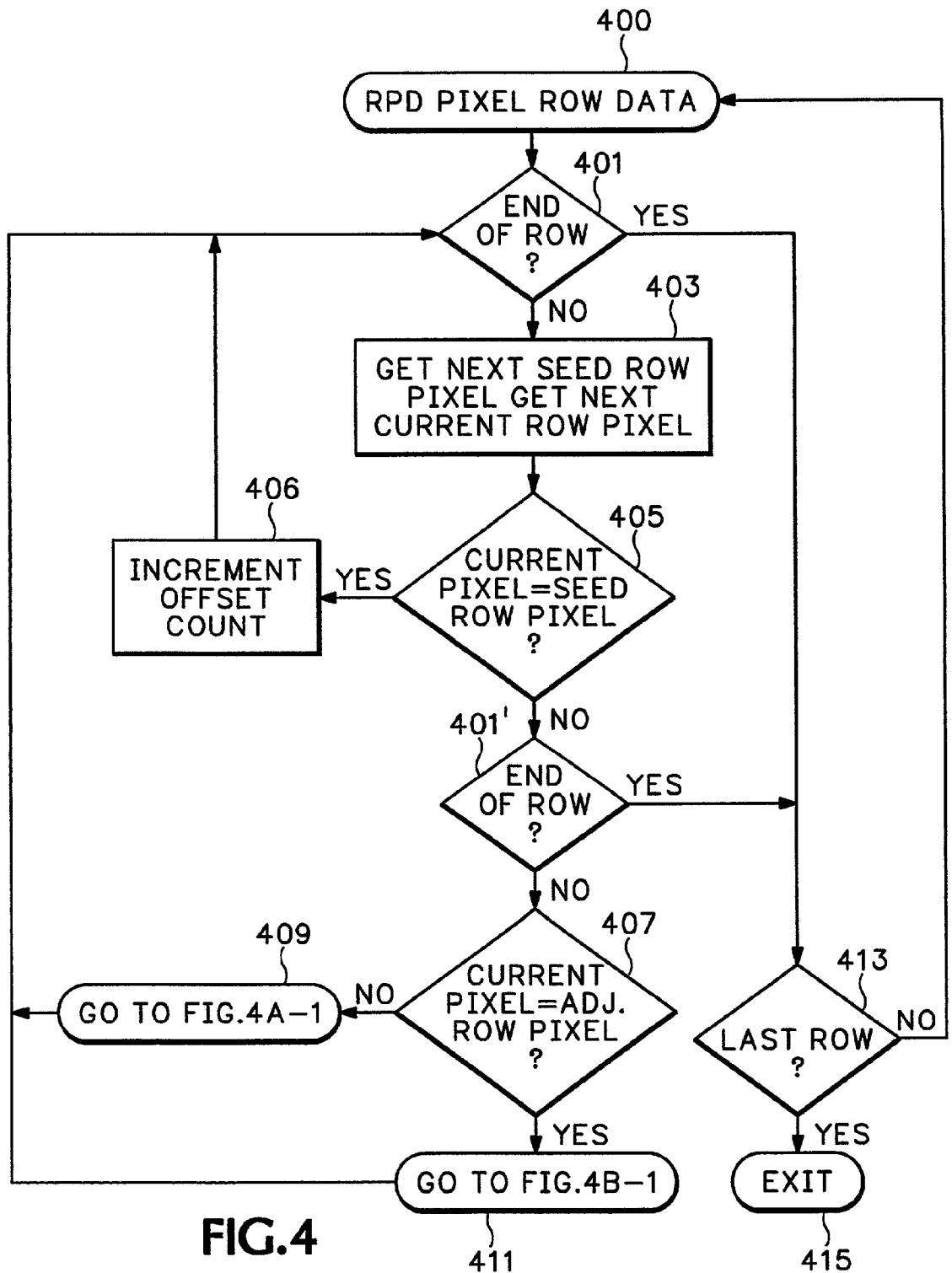
Figures 1, 4A:
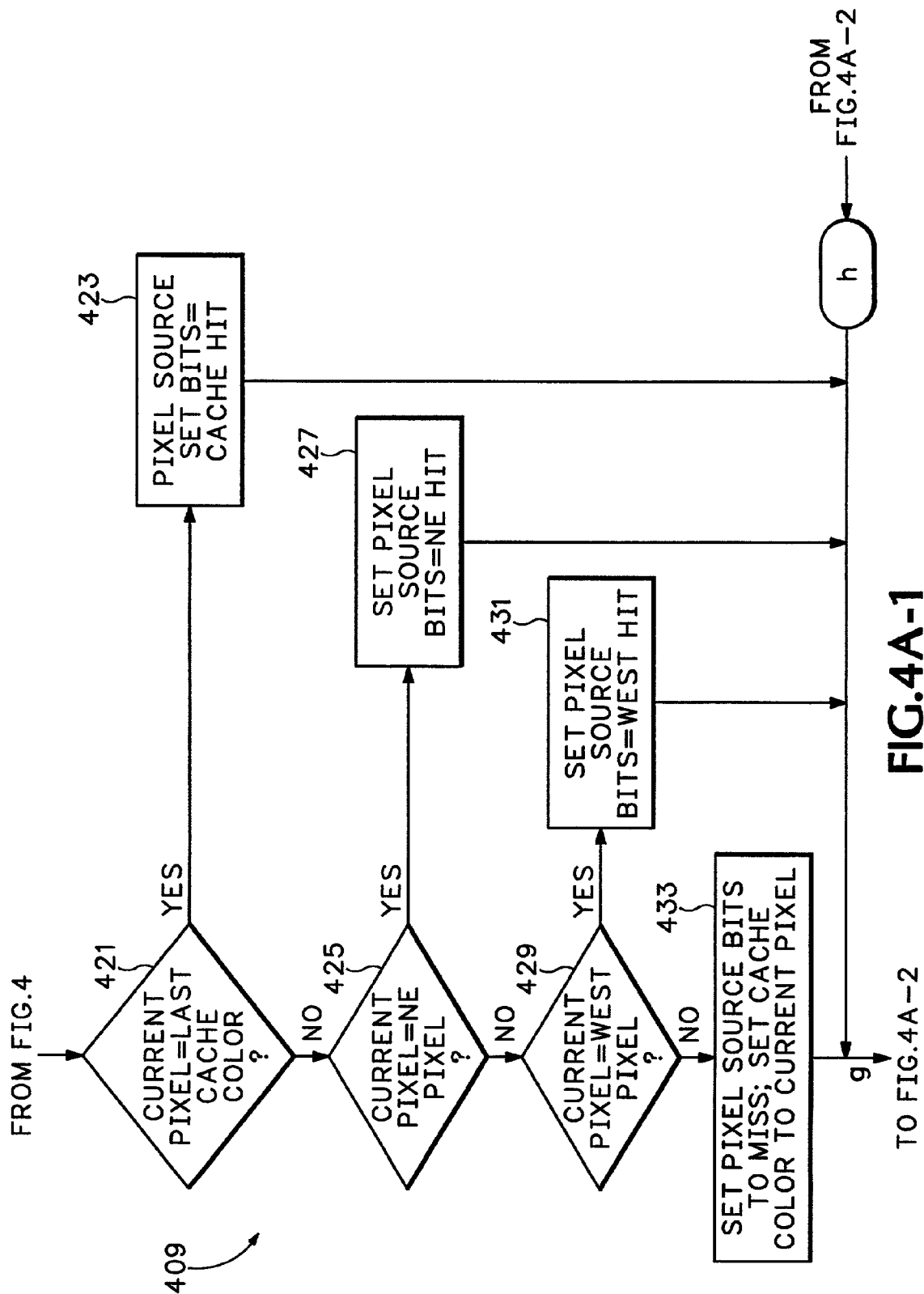
Figures 2, 4A:
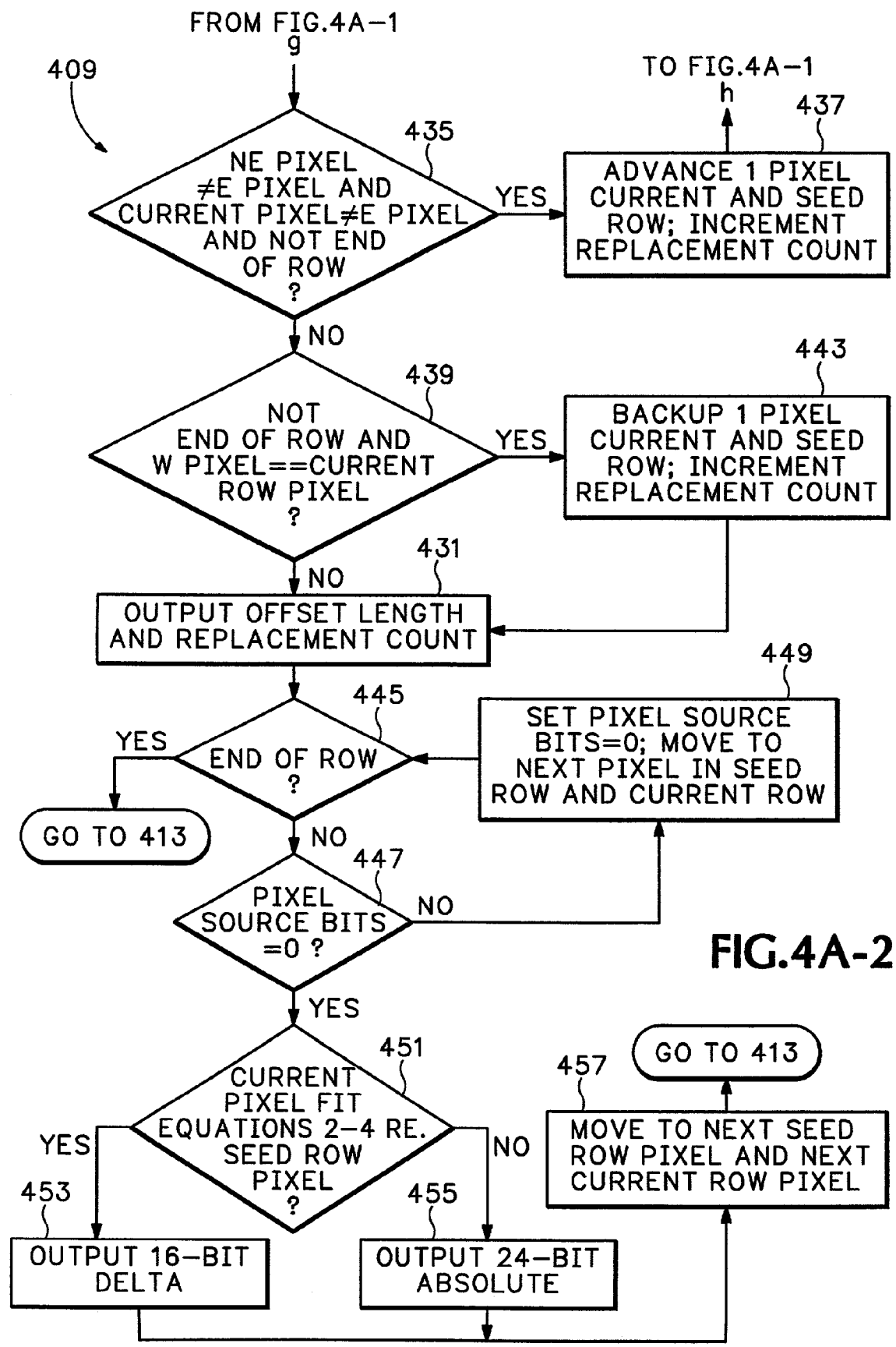
Figures 1, 4B:
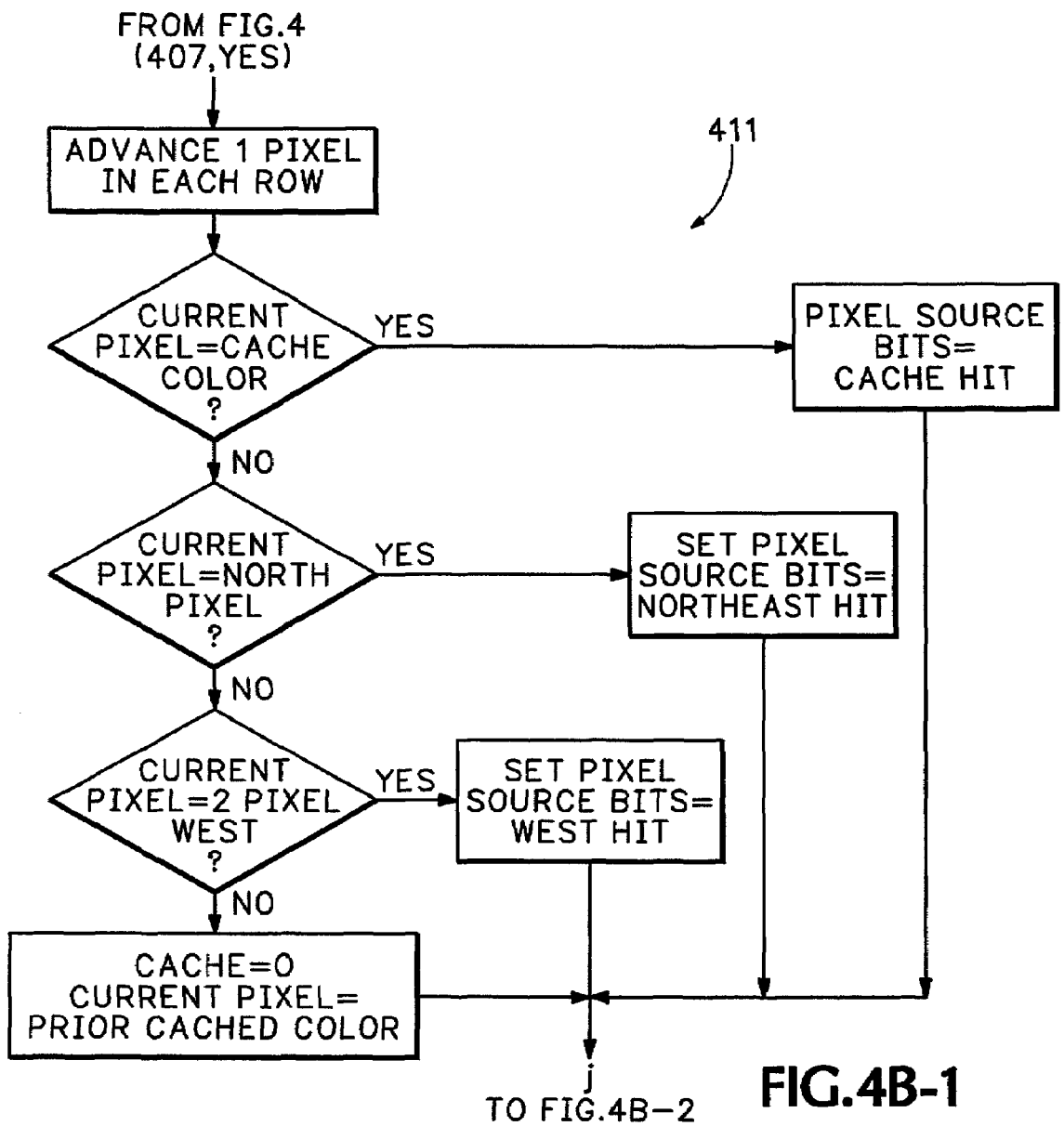
Figures 2, 4B:
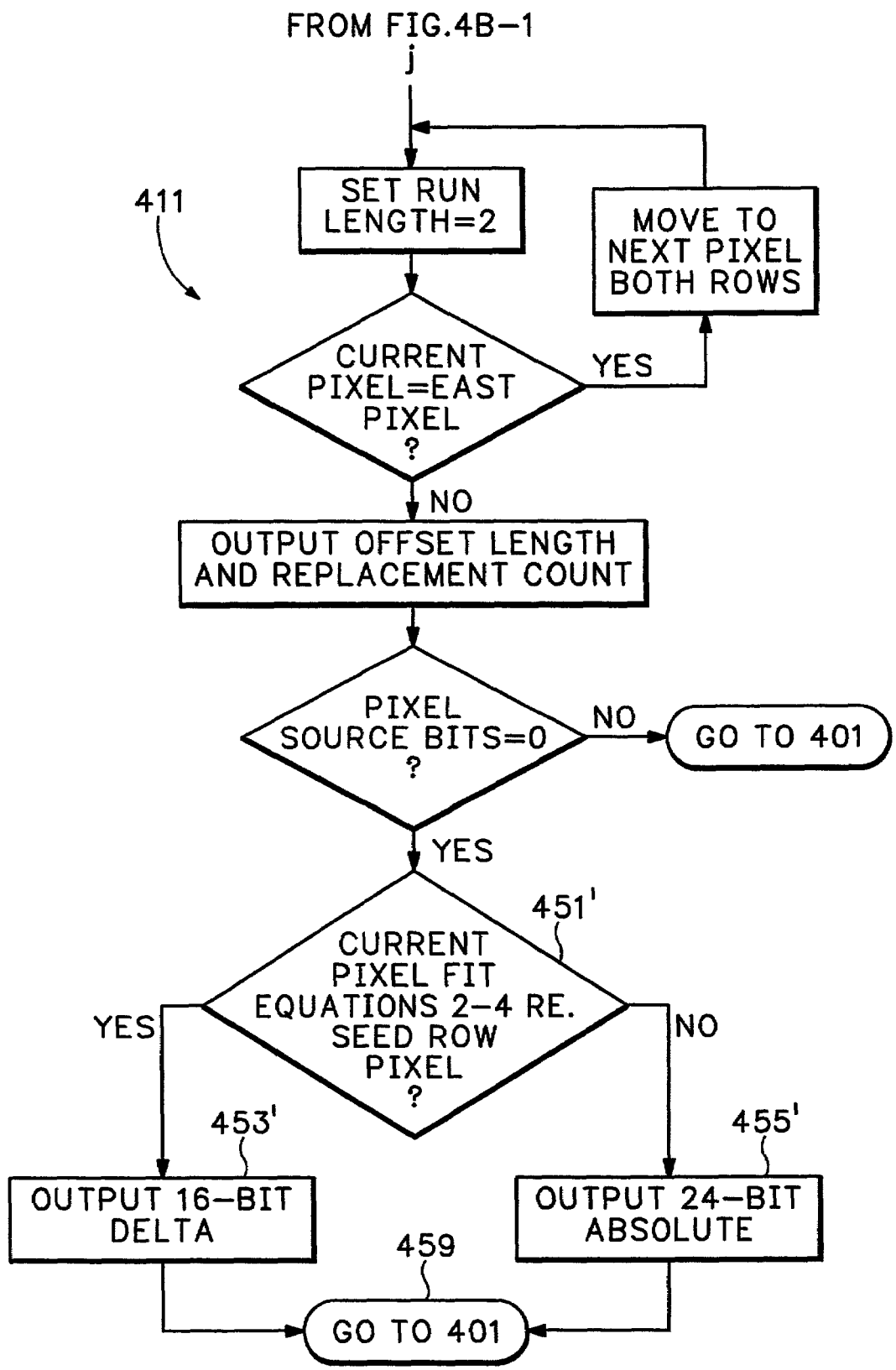

The "Command Byte" has four segments:
(1) "CMD Bit,"
(2) "Pixel Source Bit,"
(3) "Seed Row Count," and
(4) "Replacement Count," where "CMD Bit" is set to zero, "0," for a Replacement Pixel List, "RPL," data group, viz., FIG. 4A path, and set to one, "1," for a Replacement Pixel Run, "RPR," data group, viz., FIG. 4B path;

"Pixel Source Bit" indicates what color the compression run will be, where:
0=new color (no caching is being used),
1=use west (i.e., preceding column, same row) color,
2=use northeast (i.e., superjacent row, following column) color,
3=use a cached color, where for RPR groups Pixel Source bits indicate the color for an entire compression run of the FIG. 4B path since only one color needs to be specified; and for RPL Data compression runs of the FIG. 4A path, the Pixel Source bits indicate the color for just the initial pixel in the run and remaining pixels are encoded in the Data Bytes field; and the cache color is updated by each encoded new color (color cache begins with white for each raster by definition); the location is relative to the current pixel location after the seed row copy run (where "seed row copy run" means the number of consecutive pixels to copy from the seed row);

"Seed Row Count" is the number of pixels to copy from the seed row; and

"Replacement Count" is the number of consecutive pixels to be replaced (in the preferred embodiment, for RPL Data transfers this is one less than the actual number (e.g., a replacement of six pixels is specified with a count of five); and for RPR transfers this is two less than the actual number).

If the Seed Row Count of the Command Byte is greater than two, additional offset values, are set in the Optional Pixel Bytes field of the replacement data string which are added to the total Seed Row Count. This happens until the last Seed Row Count byte is indicated by a value less than two-five-five (255). If the Replacement Count in the Command Byte is greater than six, additional values are set in the Optional Replacement Count Bytes field of the replacement data string that are added to the total Replacement Count. This happens until the last Replacement Count value is indicated by a value less than two-five-five (255).

If the CMD bit is "0," the replacement data is a RPL encoded string. The number of pixels immediately following a command and its optional bytes is the Replacement Count +1. One exception occurs when Pixel Source does not indicate a new color or the first pixel; then the number of pixels following the Command and its optional bytes is the Replacement Count.

If the CMD bit is "1," the replacement data is a RPR encoded string; optional Seed Row Count bytes and Replacement Count bytes may be added. If the Pixel Source Bit indicates a new color, then it will be encoded in the Data Bytes field. Otherwise the color of the RPR will be obtained from an alternate source, as explained hereinafter, and there will be no Data Bytes. Just as in the RPL Data case, an encoded pixel will be of the absolute form or a relative value, viz. an encoded replacement form. The length of the run, in pixels, is the Replacement Count +2.

In combination with FIG. 4, FIG. 4A shows a RPL Data group compression run, i.e., the RPR Bit=0. Each current pixel color is encoded as either a RGB absolute value or a RGB relative value from the corresponding seed row pixel. Only pixels in the current row that differ from their respective seed row value are replaced. The relative color pixel value is a signed number to be added to the corresponding R or G or B component from the current pixel's companion seed row comparison pixel R or G or B component, respectively. From FIG. 4, is known that the current pixel is not the same value as its "north" seed row pixel, step 405, No-path. A determination 407 is made as to whether the current pixel is the same color value as predetermined adjacent pixel in the current row, or "east," pixel. If so, an RPR compression subroutine 411 is run; if not, a raw pixel comparison difference compression, or RPL Data, subroutine 409 is run.

If the current pixel is not the same color as the west pixel, the RPL Data subroutine 409 first determines 421 if the current pixel is defined as identical to the last cached color and the Pixel Source Bit is set 423 to three (see FIG. 5 explanation above). If not, the current pixel is compared 425 to a superjacent next column pixel, the "northeast" pixel. If so, the Pixel Source Bit is set 427 to two. If not, the current pixel is compared 429 to the current row previous pixel color value. If the same, the Pixel Source Bit is set 431 to one; if not, the Pixel Source Bit is set 433 to zero and the cached color is the current pixel color.

Once the Pixel Source Bit is appropriately set, a determination 435 is made as to whether the northeast pixel and east pixel to the current pixel are not equal and whether the current pixel and east pixel are not equal and that the end of the row has not been reached. If so, the test can be shifted ahead, east, one pixel and re-run, incrementing the Replacement Count each time, step 437. When the test 435 finally fails, a determination 439 is made whether the west pixel is the same as the current pixel. If not, the Offset Length and Replacement Count is set 441; if true, the run backs up 443 one pixel in both rows, decrementing the pixel count for end-of-row determination, and then the Offset Length and Replacement Count is set 441. If the run on the data is at the end of a current row 445, the process returns to the top level routine, starting a compression run of the next row of the RPD data 403 unless the current row was the last row 413 and the compression run ends 415. If not, at the end of a current row, the Pixel Source Bit is reset, loop 447, 449, 445, 447. A determination 451 is then made whether the current pixel, that is, the pixel that started the comparison-and-shift test just completed, can be encoded, reducing the data set.

Whether a RPL Data run 409 or a RPR Data run 411, FIG. 4B, the decision 451 as to whether a relative color pixel or an absolute color coordinate pixel value is used. In combination with FIG. 4, when 407 the current pixel is the same color as the east pixel, a RPR group compression run 411, i.e., the RPR Bit=1, is performed on the current pixel. Subroutine 411 is similar in Pixel Source Bit setting to subroutine 409 without repeating the step-by-step description here. Thus, known manner run length encoding is used, combined with the same caching scheme as in the RPL Data run. Again, Optional Offset Bytes and Replacement Bytes may be added. The single pixel to be replicated follows the Command Byte in either the absolute value or relative value. The length of the run, in pixels, is the |Replacement Count+2|.

Therefore, at the heart of the compression algorithm, for either subroutine is the decision 451 whether a relative color pixel or an absolute color coordinate pixel value is used in the data field, where:

$-16 \leq Red_{current[7,0]} - Red_{seed\ row[7,0]} \leq 15$ \hfill (Equation 2)

$-16 \leq Green_{current[7,0]} - Green_{seed\ row[7,0]} \leq 15$ \hfill (Equation 3)

$-32 \leq Blue_{current[7,1]} - Blue_{seed\ row[7,0]} \leq 30,$ \hfill (Equation 4)

when true the current pixel data is output as a 15-bit relative value when false is output as a 23-bit absolute value, as also shown in FIG. 5. Replacement pixels normally require 3-bytes to fully define the 24-bit RGB pixel. However, most replacement pixels are substantially similar to the corresponding pixels in the previous row. This enables most pixels to be encoded as a set of three relative values where each RGB component is defined as a small signed integer that is added to the corresponding seed row pixel component to create the current pixel. Because some pixels are substantially different in color and require a full 24-bit RGB definition, the present invention provides a way to indicate whether the encoded pixel is a relative color or an absolute color pixel. This indication is provided by reserving a single bit in the encoded pixel to indicate whether it is a 15-bit relative pixel or a 24-bit absolute pixel. Furthermore, enabling the compression format to encode all commands and data as full byte quantities greatly reduces compression and decompression complexity and computation time. Therefore, a Relative Pixel Flag bit 511, FIG. 5, requires that a 24-bit absolute pixel value be reduced to 23-bits to reserve room for the Relative Pixel Flag bit. Because the blue channel is substantively less visible than either the red or green channels, blue can be adequately encoded with only 7-bits of precision for most applications; thus, the differences in Equation 4. Likewise, a 15-bit relative pixel (a set of five, signed, quantities for R, G, and B) also drops the lowest significant bit for the blue channel, enabling the blue channel to encode a dynamic range of −32 to +30 instead of the −16 to +15 as for red and green. [While this is a preferred embodiment suited for industrial application in ink-jet printing, it will be recognized by a person trained in the art of data compression that a fully loss-less algorithm that encodes the full 8-bits of precision for the blue channel can be encoded by either dispensing with the relative color portion of the compression algorithm or by enabling non-byte aligned data so that the 1-bit flag can be encoded along with the full 24-bit RGB absolute color.]

A current pixel color value, viz., the color space data triplet, within the boundary conditions of Equations 2–4 is replaced 453, 453' with a 16 bit-relative value from the known seed row pixel. A current pixel outside the boundary conditions retains 455, 455' the 24-bit absolute color bits.

When on a RPL Data compression run 409, since the current pixel is not the same as either its north pixel 405/No or its west pixel 407/No, the subroutine 409 can move to the next pixel in the seed row and current row before outputting the replacement string, looping to the end of the row before returning to the top level routine 109. When on a RPR compression run 411 where the current pixel was only the same as its west pixel, the run immediately returns 459 to the top level routine 109. Thus, the compression algorithm 109 is retaining individual pixel image data values of the color image raster data set that are different from the north pixel adjacent thereto and the northeast pixel adjacent thereto and the west pixel adjacent thereto and any cached pixel data, encoding individual pixel image data values for pixels in the current pixel row.

It can now be recognized that in combination with the caching information provided by the Pixel Source Bit, that a number of pixels in a current row that are within the decision boundaries can be replaced by a single string. The present invention provides a data compression for images that is especially effective on images that have been scaled to a higher raster resolution. Most 300-dpi images that have been pixel replicated to 600-dpi can be compressed at a ratio of 18:1; 150-dpi images scaled to 600-dpi can be compressed at a ratio of 70:1. Furthermore, decompression is relatively fast when implemented by software in accordance with the present invention. Tests have shown a Motorola™ Coldfire 3, 48-MHZ processor decompresses a typical full-color, 8×10-inch, 600-dpi, business graphics document in under 100-milliseconds; a full page, 300-dpi, color image, rasterized to 600-dpi decompresses in just under 2-seconds.

Thus the present invention provides a fast, raster-based, data compression technique for the printing of compound documents by processing images in an original page description form of the data before it is rasterized and compressing the rasterized page description. A fast, raster-based, substantially loss-less (see Equation 4) data compression technique for the printing of compound documents of filtered image data, achieving relatively high compression ratios on compound documents. Overall, this system process is much faster than compressing scaled image data because there is much less data to process (for example, a full 8-inch by 10-inch, 150-dpi color photo image contains about 5.1-megabytes of data, but after scaling to 600-dpi would contain about 82-megabytes of data).

Returning to FIG. 1, the output of the compression algorithm is compressed raster data 111 which can be efficiently transmitted over the I/O connection.

The foregoing description of the preferred embodiment of the present invention has been presented for purposes of illustration and description. It is not intended to be exhaustive or to limit the invention to the precise form or to exemplary embodiments disclosed. Obviously, many modifications and variations will be apparent to practitioners skilled in this art. Similarly, any process steps described might be interchangeable with other steps in order to achieve the same result. The embodiment was chosen and described in order to best explain the principles of the invention and its best mode practical application, thereby to enable others skilled in the art to understand the invention for various embodiments and with various modifications as are suited to the particular use or implementation contemplated. It is intended that the scope of the invention be defined by the claims appended hereto and their equivalents.

What is claimed is:

1. A data compression method for compound document data, the method comprising:
   receiving a first data set representing a compound document page including both an alphanumeric text data subset and at least one image data subset;
   extracting the image data subset;
   compression-enhancement-filtering the image data subset and outputting a filtered image date subset;
   recombining the filtered image data subset with the alphanumeric text data, forming a second data set;
   rasterizing the second data set and outputting a third data set of rasterized page description data;
   compressing the rasterized page description data by retaining individual pixel image data values for each recorded pixel color value of the color image raster data set that is different from both a preceding row, same column, pixel and a horizontally adjacent, same row, preceding pixel;
   for each retained pixel image data value, encoding individual pixel image data values for pixels in a current pixel row with replacement data strings by replacing pixel image data values for current pixels in a current pixel row with replacement byte strings wherein the byte strings are structured in the form of a Command field and a Data field, wherein the replacement data strings include a replacement positioning code and a replacement count code for replicating retained pixel image data values for subsequent raster data decompression as a group of substantially identical color value pixels; and
   outputting a fourth set of compressed rasterized page description data.

2. The method as set forth in claim 1 wherein the step of replacing further comprises:
   including four segments in the Command field including
   (1) CMD) Bit,
   (2) Pixel Source Bit,
   (3) Seed Row Count, and
   (4) Replacement Count,
   wherein (1) "CMD Bit" is set to zero, "0," for a Replacement Pixel List, RPL, data group and set to one, "1," for a Replacement Pixel Run, "RPR," data group, (2) "Pixel Source Bit" indicates what color the compression run will be wherein when set to
   0=new color (no caching is being used),
   1=use preceding column, same row color,
   2=use superjacent row, following column color,
   3=use a cached color,
   wherein for RPR groups the Pixel Source bit indicates the color for an entire compression run and for RPL data compression runs the Pixel Source bit indicates color for an initial pixel in the compression run and remaining pixels are encoded in a separated Data Bytes field, and the cached color is updated by each encoded new color, (3) "Seed Row Count" is number of pixels to copy from the seed row, and (4) "Replacement Count" is number of consecutive pixels to be replaced.

3. The method as set forth in claim 2, comprising:
   including in the Data field either absolute values of the color image data value for a current pixel, or
   if a current pixel is close in color value to a vertically adjacent pixel but not identical to color value of; same row, horizontally adjacent, preceding pixel color or vertically adjacent, next column pixel color, recording in the Data field a reduced size bit set value encoding a difference value between the current pixel color value and the vertically adjacent pixel color value.

4. The method as set forth in claim 3, comprising:
   determining if the current pixel is close in color value but not identical to color value of an adjacent pixel thereto in accordance with the equation $$a < \text{Color}_{current\ pixel} - \text{Color}_{seed\ row\ pixel} < b,$$

where a and b are predetermined threshold limits such that a difference outside the limits results in recording absolute values in the Data field and a difference within the limits results in recording a difference value in the Data field.

5. The method as set forth in claim 4, comprising:
a. when the current pixel is a same color value as the vertically adjacent row pixel, incrementing the Seed Row Count;
b. selecting a next pixel horizontally following the current pixel as a new current pixel; and
c. repeating steps a and b, until a new current pixel is not a same color value as the vertically adjacent row pixel.

6. The method as set forth in claim 5, further comprising:
d. when a current pixel is not identical in color value to the vertically adjacent preceding pixel, determining if the current pixel is the same color value as the horizontally adjacent preceding pixel;
e. when the current pixel is not identical in color value to the vertically adjacent preceding pixel and the current pixel is identical in color value to the horizontally adjacent preceding pixel, executing an Replacement pixel run data compression encoding at the current pixel and returning to step b.; and
f. when the current pixel is not identical in color value to the vertically adjacent preceding pixel and the current pixel is not identical in color value to the horizontally adjacent preceding pixel, encoding pixel image data values for pixels in a current pixel row with replacement data strings wherein the replacement data strings include an seed row count code and a replacement positioning code for replicating retained pixel image data values for subsequent raster data decompression as a group of substantially identical color value pixels and returning to step b.

7. The method as set forth in claim 6, comprising:
designating the color value by the Pixel Source Bit.

8. The method as set forth in claim 4, comprising:
deciding whether a relative color pixel or an absolute color coordinate pixel value is used in the data field according to the equations:

$$-16 \leq \text{Red}_{current[7,0]} - \text{Red}_{seed\ row\ [7,0]} \leq 15,$$

$$-16 \leq \text{Green}_{current[7,0]} - \text{Green}_{seed\ row\ [7,0]} \leq 15, \text{ and}$$

$$-32 \leq \text{Blue}_{current[7,1]} - \text{Blue}_{seed\ row[7,0]} \leq 30,$$

such that when true, current pixel data is output as a 15-bit relative value, and when false, current pixel data is output as a 23-bit absolute value.

* * * * *